(12) United States Patent
Minopoli et al.

(10) Patent No.: US 12,100,438 B2
(45) Date of Patent: Sep. 24, 2024

(54) METHODS, DEVICES AND SYSTEMS FOR AN IMPROVED MANAGEMENT OF A NON-VOLATILE MEMORY

(71) Applicant: Micron Technology, Inc., Boise, ID (US)

(72) Inventors: Dionisio Minopoli, Frattamaggiore (IT); Marco Sforzin, Cernusco sul Naviglio (IT); Daniele Balluchi, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 120 days.

(21) Appl. No.: 17/404,487

(22) Filed: Aug. 17, 2021

(65) Prior Publication Data

US 2022/0068367 A1  Mar. 3, 2022

Related U.S. Application Data

(63) Continuation of application No. PCT/IB2020/020047, filed on Aug. 25, 2020.

(51) Int. Cl.
*G11C 7/04* (2006.01)
*G11C 11/406* (2006.01)
*G11C 11/4076* (2006.01)

(52) U.S. Cl.
CPC .. *G11C 11/40626* (2013.01); *G11C 11/40615* (2013.01); *G11C 11/40622* (2013.01); *G11C 11/4076* (2013.01)

(58) Field of Classification Search
CPC ............................................. G11C 11/40626
See application file for complete search history.

(56) References Cited

U.S. PATENT DOCUMENTS 10,761,769 B2    9/2020  Cadloni et al.
2002/0191467 A1* 12/2002 Matsumoto ........... G11C 11/406
                                             365/222
2007/0019488 A1  1/2007  Heilmann et al.
(Continued)

OTHER PUBLICATIONS

International Search Report and Written Opinion, PCT/IB2020/020047, mailed on May 18, 2021.

*Primary Examiner* — Min Huang
(74) *Attorney, Agent, or Firm* — Greenberg Traurig

(57) ABSTRACT

A method including obtaining temperature values of at least one region of the non-volatile memory, each temperature value obtained at a given time instant, for each obtained temperature value at each given time instant, calculating the value of an operating function representative of an operating condition of the non-volatile memory, the value such operating function being time-dependent according to the temperature time-variation of such at least one region of the non-volatile memory, summing subsequent computed values of said operating function to obtain an accumulated value being representative of an elapsed fraction of a time limit associated with the at least one region of the non-volatile memory, comparing the accumulated value with a threshold value, and, based on said comparison, performing a management operation on the cells of the at least one region of the non-volatile memory when the accumulated value has a magnitude equal or greater than the threshold value.

25 Claims, 9 Drawing Sheets

(56) References Cited

U.S. PATENT DOCUMENTS

| | | | |
|---|---|---|---|
| 2009/0091996 A1* | 4/2009 | Chen | G11C 7/04 |
| | | | 365/212 |
| 2011/0219203 A1* | 9/2011 | Nurminen | G11C 11/406 |
| | | | 711/E12.001 |
| 2013/0008149 A1* | 1/2013 | Ukropec | F01N 11/005 |
| | | | 702/30 |
| 2014/0226389 A1* | 8/2014 | Ebsen | G06F 16/9014 |
| | | | 365/148 |
| 2017/0255403 A1 | 9/2017 | Sharon et al. | |
| 2018/0260007 A1* | 9/2018 | Ping | H05K 7/20836 |

\* cited by examiner though this amount of time being referred to as retention time limit. Beyond this retention time limit, data can be corrupted or lost. Therefore, many memory technologies, even non-volatile memories, show retention issues that may be solved by a proper refresh mechanism. Even non-volatile Emerging Memory (EM) technologies thus need refresh cycles in order to have a proper reliability level in terms of data retention.

METHODS, DEVICES AND SYSTEMS FOR AN IMPROVED MANAGEMENT OF A NON-VOLATILE MEMORY

CROSS-REFERENCE TO RELATED APPLICATION

The present application is a continuation application of International Patent Application No. PCT/IB2020/020047, filed on Aug. 25, 2020, and entitled "METHODS, DEVICES AND SYSTEMS FOR AN IMPROVED MANAGEMENT OF A NON-VOLATILE MEMORY," the entire disclosure of which application is hereby incorporated herein by reference.

TECHNICAL FIELD

The present disclosure relates generally to methods, devices and systems concerning non-volatile memories and the management thereof, and more particularly to methods, devices and systems for an improved refresh technique of a non-volatile memory.

BACKGROUND

It is known that non-volatile memory devices undergo data retention degradation, i.e. corruption or even loss of data in the non-volatile memory. Such data retention degradation is due to several causes, such as a charge loss and stress-induced leakage, as well as the usage of the device itself. Moreover, data retention degradation is heavily dependent on the temperature of the non-volatile memory.

The data in the non-volatile memory can thus be properly retained only for a finite amount of time, this amount of time being referred to as retention time limit. Beyond this retention time limit, data can be corrupted or lost. Therefore, many memory technologies, even non-volatile memories, show retention issues that may be solved by a proper refresh mechanism. Even non-volatile Emerging Memory (EM) technologies thus need refresh cycles in order to have a proper reliability level in terms of data retention.

A refresh operation typically comprises re-writing data contained in the memory cells of the non-volatile memory. Such operation wastes time, energy and reduces the availability of the stored data. The refresh benefits are thus detrimental to the quality of service (QoS) and to the energetic performances of the memory device. Usually, the refresh policy is applied at fixed time intervals; for this reason, a mechanism able to determine an optimal number of refresh events is desired to balance reliability, performance and QoS, in this way mitigating the refresh cost.

The aim of the present disclosure is therefore to provide a technique to precisely evaluate when the non-volatile memory has to be refreshed.

DETAILED DESCRIPTION

With reference to those figures, methods, devices and systems involving non-volatile memories will be disclosed herein.

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of non-volatile memory cells arranged in a matrix of rows and columns. Each cell is coupled to an access line and/or a data line. The cells are programmed and erased by manipulating the voltages on the access and data lines. Flash memories are well established and well suited for mass storage applications; however, their performances do not meet present day most demanding applications. New technologies, for example 3D Cross Point (3DXPoint) memories and Self-Selecting Memories (SSM) have better performances, for example in terms of access time and access granularity (data may be programmed and read with page, word or—in principle—even bit granularity).

Figure 1:
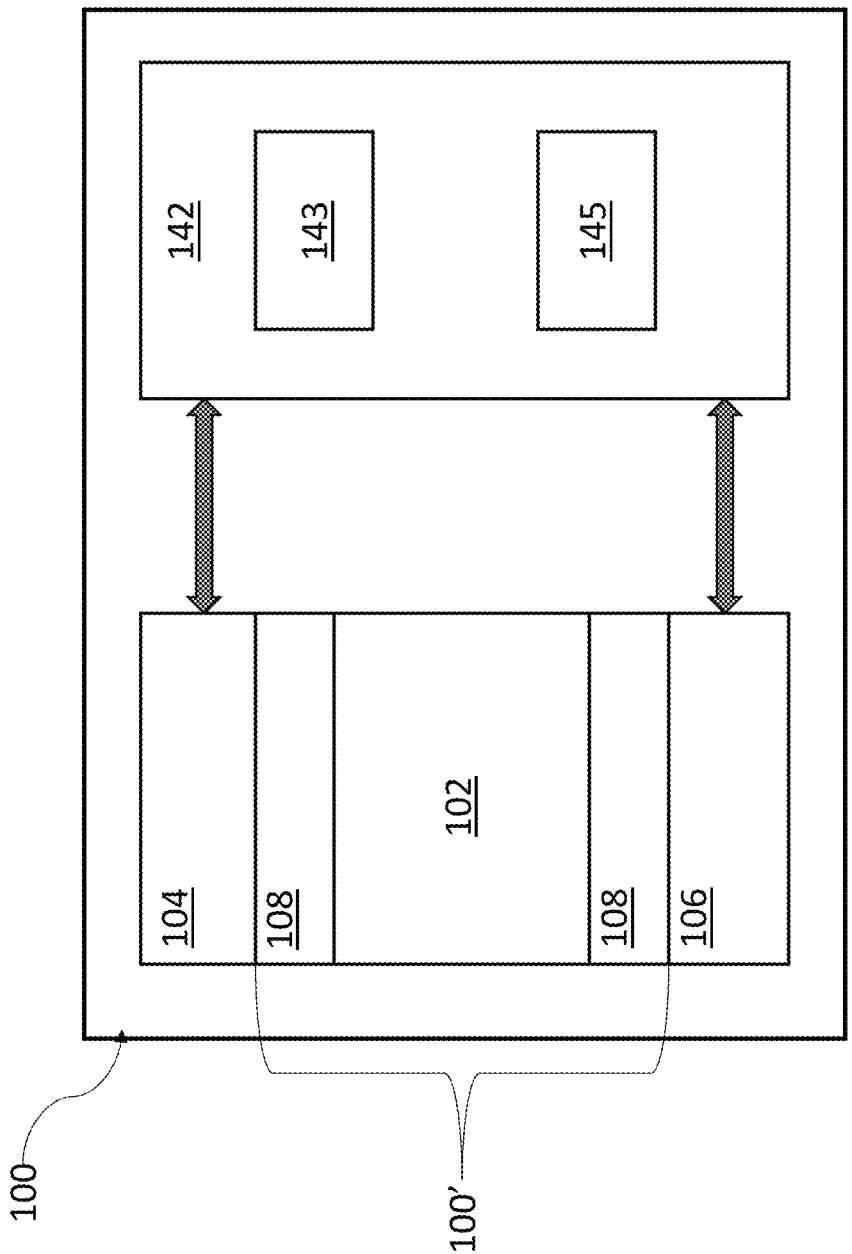
FIG. 1 is an exemplary block scheme illustrating an exemplary memory cell that can be managed according to embodiments of the present disclosure.

FIG. 1 illustrates a block scheme of an exemplary assembly 100 comprising a memory cell 100' that can be arranged in an array and then managed according to the present disclosure.

In the embodiment illustrated in FIG. 1, the memory cell 100' includes a storage material 102 between access lines 104 and 106. The access lines 104, 106 electrically couple the memory cell 100' with circuitry 142 that writes to and reads from the memory cell 100'. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one embodiment, the storage material 102 includes a self-selecting material that exhibits memory effects. A self-selecting material is a material that enables selection of a memory cell in an array without requiring a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to access circuitry 143. Access circuitry can store information in the memory cell 100' by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one embodiment, the memory cell 100' is a self-selecting memory cell that includes a single layer of material that acts as both a selector element to select the memory cell and a memory element to store a logic state, i.e. a state related to a given polarity of the cell.

In one embodiment, the storage material 102 is a phase change material. A phase change material can be electrically switched between a generally amorphous and a generally crystalline state across the entire spectrum between completely amorphous and completely crystalline states. The memory cell 100' may further include a selection device (not shown) between access lines 104 and 106; the selection device may be serially coupled to the storage material 102. In another embodiment, the storage material 102 is not a phase change material. In one embodiment in which the storage material 102 is not a phase change material, the storage material is capable of switching between two or more stable states without changing phase. The access circuitry 143 is able to program the memory cell 100' by applying a voltage with a particular polarity to cause the storage material 102 to be in the desired stable state.

In one such embodiment, programming the memory cell 100' causes the memory cell 100' to "threshold" or to undergo a "threshold event." When a memory cell thresholds (e.g., during a programming voltage pulse), the memory cell undergoes a physical change that causes the memory cell to exhibit a certain threshold voltage in response to the application of a subsequent voltage (e.g., a read voltage with a particular magnitude and polarity). Programming the memory cell 100' can therefore involve applying a voltage of a given polarity to induce a programming threshold event, which causes the memory cell 100' to exhibit a particular threshold voltage at a subsequent reading voltage of a same or different polarity. In one such embodiment, the storage material 102 is a self-selecting material (e.g., a non-phase change chalcogenide material or other self-selecting material) that can be programmed by inducing a threshold event.

As mentioned above, the access lines 104, 106 electrically couple the memory cell 100' with circuitry 142. The access lines 104, 106 can be referred to as a bitlines and wordlines, respectively. The wordline is for accessing a particular word in a memory array and the bitline is for accessing a particular bit in the word. In one embodiment, the access lines 104, 106 can be made of one or more suitable metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 108 are disposed between storage material 102 and access lines 104, 106. Electrodes 108 electrically couple access lines 104, 106 with storage material 102. Electrodes 108 can be made of one or more conductive and/or semiconductive materials such as, for example: carbon (C), carbon nitride (CxNy); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including RuO2, or other suitable conductive materials.

The stack made of electrodes 108 and storage material 102 is hereinafter referred to as the memory cell 100', without limiting the scope of the disclosure. In various embodiments, the memory cell 100' may comprise more or less elements (e.g. only the storage material 102, or comprising other layers). Therefore, the memory cell 100' is one example of a memory cell. Other embodiments can include memory cells having additional, less, or different layers of material than the ones illustrated in FIG. 1 (e.g., a thin dielectric material between the storage material and access lines, and the like).

Referring again to the circuitry 142, the access lines 104, 106 communicatively couple the circuitry 142 to the memory cell 100', in accordance with an embodiment. The circuitry 142 includes access circuitry 143 and sense circuitry 145. Circuitry includes electronic components that are electrically coupled to perform analog or logic operations on received or stored information, output information, and/or store information. Hardware logic is circuitry to perform logic operations such as logic operations involved in data processing. In one embodiment, the access circuitry 143 applies voltage pulses to the access lines 104, 106 to write to or read the memory cell 100'. The terms "write" and "program" are used interchangeably to describe the act of storing information in a memory cell. To write to the memory cell 100', the access circuitry applies a voltage pulse with a particular magnitude and polarity to the access lines 104, 106, which can both select memory cell 100' and program memory cell 100'.

For example, the access circuitry 143 applies a read voltage with one polarity to program the memory cell 100' to be in one logic state, and applies a pulse with a different polarity to program the memory cell 100' to be in a different logic state. The access circuitry 143 can then differentiate between different logic states as a consequence of the programming polarity of a memory cell. For example, in a case of a memory read, the access circuitry 143 applies a voltage pulse with a particular magnitude and polarity to the access lines 104, 106, which results in an electrical response that the sense circuitry 145 can detect. Detecting electrical responses can include, for example, detecting one or more of: a voltage drop (e.g., a threshold voltage) across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100' based on electrical responses to one or more of the voltage pulses in a read sequence. The electric current generated upon application of a reading voltage thus depends on the threshold voltage of the memory cell determined by the electrical resistance of the logic state storage element. For example, a first logic state (e.g., SET state) may correspond to a finite amount of current, whereas a second logic state (e.g., RESET state) may correspond to no current or a negligibly small current. Alternatively, a first logic state may correspond to a current higher than a current threshold, whereas a second logic state may correspond to a current lower than the current threshold.

Figure 2:
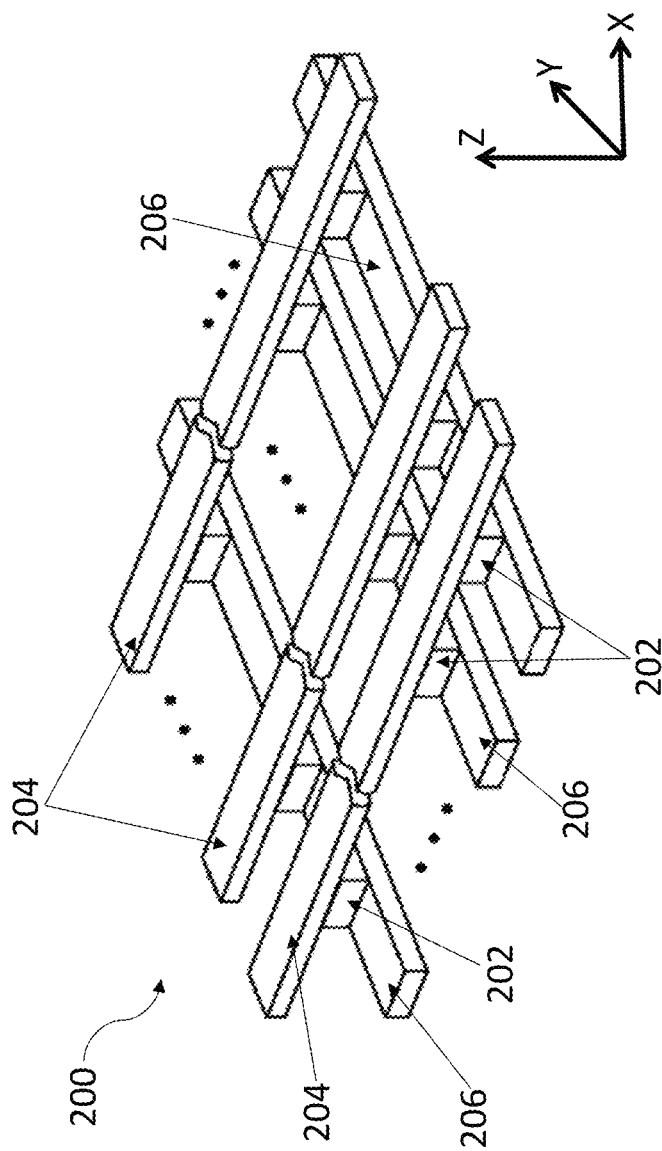
FIG. 2 schematically illustrates a portion of an exemplary memory cell array.

FIG. 2 shows a portion of a memory cell array 200, which can include a plurality of memory cells such as the memory cell 100' of FIG. 1, in accordance with an embodiment. The memory cell array 200 is an example of a three-dimensional cross-point memory structure (3DXPoint). The memory cell array 200 includes a plurality of access lines 204, 206, which can be the same or similar as the access lines 104, 106 described with respect to FIG. 1. Access lines 204, 206 can be referred to as bitlines and wordlines. In the embodiment illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. As disclosed in relation to FIG. 1, storage material 202 may be a self-selecting storage material, in some examples; storage material 202 may be serially coupled to a selection device (not shown), in other examples. In one embodiment, a "cross-point" is formed at an intersection between a bitline and a wordline. A memory cell is created from the storage material 202 between the bitline and wordline where the bitline and wordline intersect (it is noted that, in FIG. 2, additional layers such as electrodes are not shown, so that the cell is schematically represented in said figure by the storage material 202 only, without limiting the scope of the disclosure, and additional layers may be present). Generally speaking, the intersection defines the address of the memory cell. The storage material 202 can be a chalcogenide material such as the storage material 102 described above with respect to FIG. 1. In one embodiment, the access lines 204, 206 are made of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction).

A "cross-point" thus refers to a place where a memory cell is formed such that access lines associated with the memory cell topologically "cross" each other as access lines connect to different nodes of the memory cell. Cross-point architecture enables reaching the theoretical minimum cell area determined by the minimum pitch of access lines.

FIGS. 1 and 2 illustrate an example of a memory cell and array. However, other memory cell structures and arrays may be used, in which the memory cells exhibit electrical responses that vary as a function of programming and read polarity. A memory cell (not shown) may be formed at crossing locations between vertical conductive pillars, acting as bitlines, intersecting horizontal conductive planes, acting as wordlines, in a 3D memory array, for example. This and other array organizations may also lead to a cross-point architecture as described above.

Operations such as programming and reading, which may be referred to as access operations, may be performed on memory cells by activating or selecting a wordline 206 and bitline 204. As known in the field, wordlines 206 may also be known as row lines, sense lines, and access lines. Bitlines 204 may also be known as digitlines, column lines, data lines, as well as access lines. References to wordlines and bitlines, or their analogues, are interchangeable without loss of understanding or operation. For example, the access lines may be wordlines and the data lines may be bitlines. Wordlines 206 and bitlines 204 may be perpendicular (or nearly perpendicular) to one another to create an array, as previously shown with reference to FIG. 2. Depending on the type of memory cell (e.g., FeRAM, RRAM, etc.), other access lines (not shown in the figures) may be present, such as plate lines, for example. It should be appreciated that the exact operation of the memory device may be altered based on the type of memory cell and/or the specific access lines used in the memory device. Activating or selecting a wordline 206 or a bitline 204 may include applying a voltage to the respective line via a dedicated driver. By activating one wordline and one bitline, a single memory cell 202 may be accessed at their intersection.

Accessing the memory cell may include reading or writing the memory cell. Accessing memory cells may be controlled through a row decoder and a column decoder (not shown). For example, a row decoder may receive a row address from a memory controller and activate the appropriate wordline based on the received row address. Similarly, a column decoder may receive a column address from the memory controller and activate the appropriate bitline.

Although they have non-volatile properties, Emerging Memory (EM) technologies (such as the three-dimensional cross-point 3DXPoint memory structures shown above) may need periodical refresh cycles. However, the refresh benefits are detrimental to the quality of service (QoS) and to the energetic performances of the non-volatile memory, and the present disclosure provides a technique to precisely define when a refresh event should be performed in the non-volatile memory.

The principles of the present disclosure may be applied to several type of non-volatile memories. For example, the principles of the present disclosure are particularly advantageous for the aforementioned 3DXPoint technology.

The retention time of the non-volatile memories cells significantly depends on the temperature, which varies with time due to several causes, such as ambient temperature, data traffic, activities of other memory components in a device and/or system, and the like. Based on this assumption, the present disclosure provides for measuring or estimating the temperature of the non-volatile memory and accumulating its effect on retention over time, and, based on this analysis, properly defining when the refresh operation should be performed.

Generally, the retention time depends on the temperature following the Arrhenius law, wherein the logarithm of the retention time T is inversely proportional to the absolute temperature θ according to the following formula;

$$T \propto e^{\frac{E_A}{k_B \theta}} \tag{1}$$

where $E_A$ is the activation energy, $k_B$ is the Boltzmann constant, and $\theta$ is the (time-varying) temperature of the non-volatile memory. For example, in 3DXPoint non-volatile memories, the activation energy $E_A$ is about 1.1 eV.

Therefore, given the retention time $T_0$ at a nominal temperature $\theta_0$ (for example, $T_0=48$ h at $\theta_0=358.15$ K, e.g., 85° C.), the retention time T at a generic temperature $\theta$ is given by:

$$T = T_0 e^{\left(\frac{E_A}{k_B\theta} - \frac{E_A}{k_B\theta_0}\right)} \quad (2)$$

For the sake of simplicity, the following function is defined:

$$f(\theta) = T_0 e^{\left(\frac{E_A}{k_B\theta} - \frac{E_A}{k_B\theta_0}\right)} \quad (3)$$

where $f(\theta)$ is an operating function of the time-varying temperature $\theta(t)$ of the non-volatile memory.

As previously mentioned, several factors define the temperature of the non-volatile memory and the time variation thereof, the temperature being a crucial variable in defining the retention ability of the memory. Advantageously according to the present disclosure, the temperature of the non-volatile memory is measured (or estimated) and a criterion to determine when the refresh event should be performed is defined based on the above equations.

More in particular, the operating function $f(\theta)$ of equation (3) defines the retention time as a function of the temperature $\theta$, and the function $\theta(t)$ is the temperature time-profile of the non-volatile memory, so that, by composing the functions $f(\theta)$ and $\theta(t)$, the composed function $f(\theta(t))$ is obtained.

The effective retention time limit T resulting from said temperature profile $\theta(t)$ thus satisfies the following equation:

$$\int_0^T \frac{dt}{f(\theta(t))} = 1 \quad (4)$$

More in particular, according to equation (4), when a time dt at the temperature $\theta$ is elapsed, a fraction $$\frac{dt}{f(\theta)}$$

of the total retention time of the non-volatile memory has been consumed. Therefore, if the T is the retention time limit associated with the temperature profile $\theta(t)$, then equation (4) is satisfied, i.e. all the retention time has been consumed by performing the sum of equation (4) in the retention time interval defined by the extremes [0, T].

For the sake of simplicity, the following function is defined:

$$g(t) = \frac{1}{f(\theta(t))} \quad (5)$$

Figure 3:
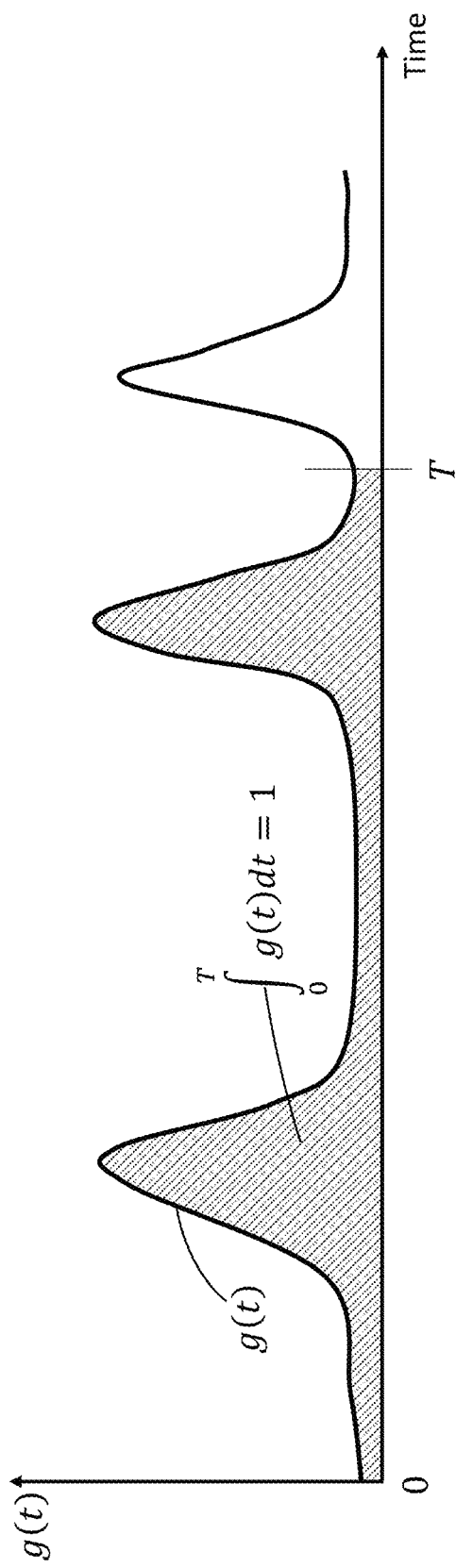
FIG. 3 shows a graph of an operating function accounting for the temperature dependence of the retention time limit of a non-volatile memory.

The retention time limit is thus reached when the area below the curve g (t) between 0 and T is equal to 1, as depicted in FIG. 3, which shows a plot of the function g(t).

The retention time limit is thus determined as the time T such that the area below g (t) and between 0 and T is 1. In other words, the function g(t) is an operating function related to an elapsed time of the non-volatile memory, and its instantaneous value varies according to the temperature experienced by the non-volatile memory: the higher is the temperature experienced by the non-volatile memory, the higher is the instantaneous value of the function g (t) and the greater becomes the area defined by said function at a given time, e.g., during the time period associated with the temperature measurement. When the value of the function g (t) is high due a high temperature of the non-volatile memory, the sum value 1 is reached earlier; for this reason, the area defined by the function g(t) at a given time is comparable to a consumed fraction of an available total time T. In any case, according to the present disclosure, a time-varying parameter indicating a consumed fraction a total time available is provided. Once the value 1 is reached, a refresh operation should be performed. Each time a refresh operation is performed at time T, the area of the function g(t) is reset and the calculation of integral (4) is newly performed.

Once the temperature profile $\theta=\theta(t)$ of the non-volatile memory is known, it is thus possible to evaluate the retention time limit resulting from said temperature profile. In other words, according to the present disclosure, first of all a plurality of temperature values $\theta$ of at least one region of the non-volatile memory is obtained, each temperature value being obtained at a given time instant $t_k$, thus defining the temperature profile $\theta(t)$ of the non-volatile memory. In an embodiment of the present disclosure, the temperature $\theta$ of the non-volatile memory is sampled at given preset time intervals $t_{k+1}-t_k$. In one embodiment, the duration of time intervals may be constant (e.g., time interval $\Delta t$ may have a preset duration that does not changes with k). In other embodiments, the time intervals may have different duration (e.g., the duration $\Delta t_k=t_{k+1}-t_k$ of different time intervals may vary with k). Depending on the case, the area of the function g(t), e.g., an accumulated value representative of an elapsed fraction of a time limit, may be evaluated summing subsequent values calculated based on respective temperature values obtained, e.g., measured, at each given time instant $t_k$, as explained below in detail, possibly correcting it according to the time interval duration variation.

Figure 4:
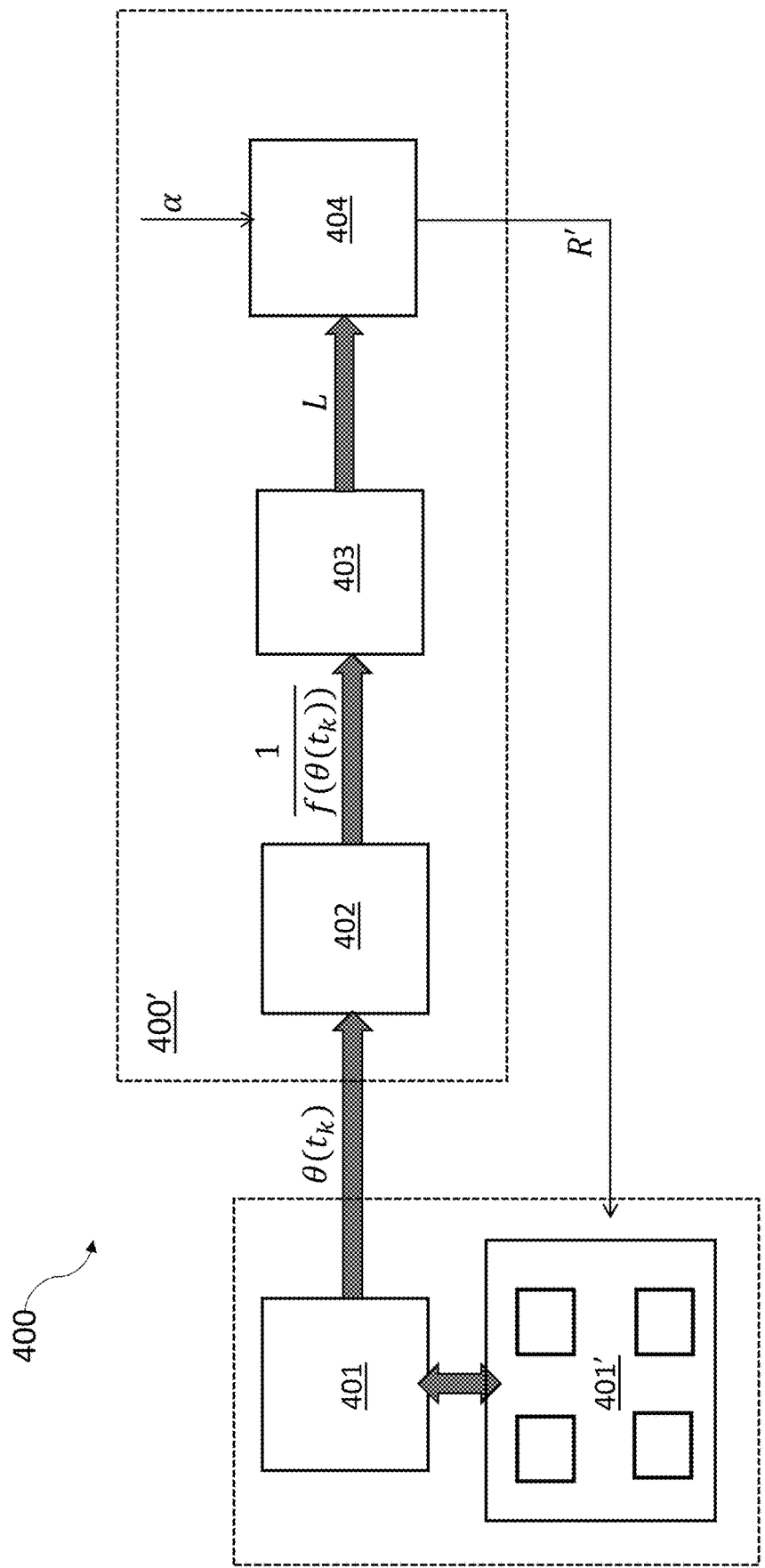
FIG. 4 shows a flow of operations and the relative components, illustrated as blocks, for performing the techniques according to the present disclosure.

FIG. 4 shows a flow of operations and a relative component assembly 400 (depicted as blocks) for performing the techniques according to the present disclosure.

More in particular, at block 401, the temperature $\theta$ at a given time $t_k$ is measured (or estimated), for instance as a certain number of bits (e.g., with a desired level of precision).

For each obtained temperature value at each given time instant, the value of the operating function $f(\theta(t_k))$ (more particularly its inverse $g(t_k)=1/f(\theta(t_k))$) is calculated at block 402, this function being representative of a time-varying operating condition of the non-volatile memory. More particularly, the value of this operating function $g(t_k)$ varies with time based on the temperature of the non-volatile memory, in particular with the temperature at each time $t_k$.

In an embodiment of the present disclosure, values of the operating function $g(t)=1/f(\theta(t))$, e.g., predetermined values of the operating function g(t), are stored in a dedicated memory portion, in particular in a look-up table stored in the memory portion. More in particular, in the look-up table, stored values of the function g(t) are each associated with a respective temperature value that may be experienced by the non-volatile memory. In other words, according to the present disclosure, the operating function g(t) is defined for a finite number of temperature values $\theta_j$ in a range of interest $[\theta_{min}, \theta_{max}]$, in this way defining the lookup table $g_j=1/f_j(\theta_j)$, i.e. the operating function is reproduced by a table of values $\theta_j, g_j$. These values can be stored in a permanent memory and used in the following blocks, i.e. the values of the operating function g(t) are calculated based on the stored look-up table and are used for performing the following calculations. In this way, over time, according to the present disclosure, the temperature of the non-volatile memory is obtained in a given temperature range $[\theta_{min}, \theta_{max}]$, and then the look-up table is used to calculate the value of the operating function corresponding to the obtained temperature.

Even more particularly, in an embodiment of the present disclosure, specific values of the function g(t) are each associated with a respective temperature interval of a plurality of temperature intervals in the range of interest $[\theta_{min}, \theta_{max}]$, the values of said function g(t) in said temperature intervals being calculated based on the look-up table. In this case, for each temperature-interval, the look-up table comprises the corresponding value of the operating function. In this way, over time, according to the present disclosure, the temperature of the non-volatile memory is obtained and then associated with a specific interval of the plurality intervals into which the whole temperature range is divided, and then the stored value of the operating function associated with said interval is provided and used. Depending on the desired accuracy and/or on the granularity used to store the predetermined values of the function g(t) in the temperature range of interest, in some embodiments, interpolation techniques may be used to calculate the value of the operating function g(t) at any temperature.

In other words, the function $f(\theta(t))$ returns the retention time once a temperature is given, the temperature depending on time. In an embodiment, the temperature range of interest $[\theta_{min}, \theta_{max}]$ may be partitioned in a plurality of separated intervals, e.g. for quantization purposes. Each of interval may have a representative value of the temperature (e.g. the mean value of the interval, or another value in the interval as the minimum value or the maximum value). At each representative value, the corresponding value of the operating function is then associated as previously disclosed.

Block 402 may be embodied for instance by a Read Only Memory (ROM), or by a set of latches properly unbalanced, or whatever circuit configured to implement an input/output function.

In this way, for each obtained temperature value at each given time instant, the value of the function $f(\theta(t))$, more particularly the inverse thereof, is calculated. The function $g(t)=1/f(\theta(t))$ is thus an operating function of the non-volatile memory accounting for the temperature dependence of the retention time.

It thus possible to define a technique to establish when the retention time is almost expired, so that the cells of the non-volatile memory shall be refreshed to prevent losing their content. This technique provides for the passage from the temperature profile $\theta(t)$ to the retention time by evaluating the aforementioned quantity $$\int_0^T \frac{dt}{f(\theta(t))},$$

which can be defined as a Retention-Time-Ratio.

In an embodiment of the present disclosure, equation (4) can be computed by discretizing the temperature (and the time) variables. More in particular, by sampling the temperature at fixed time intervals $\Delta t = t_{k+1} - t_k$, the following approximated expression is obtained:

$$L \approx \sum_{k=1}^{K} \frac{\Delta t}{f(\theta(t_k))} = \Delta t \sum_{k=1}^{K} g_k \tag{6}$$

In other words, the Retention-Time-Ratio computation is numerically performed by sampling the temperature with a reasonable frequency every $\Delta t$ (e.g. every given number of seconds) and evaluating the summation as in equation (6). In equation (6), $\Delta t$ corresponds to preset time intervals $t_{k+1}-t_k$, and K is an integer corresponding to the total number of time intervals into which the temperature profile is sampled. At each time interval, the value stored in the look-up table is used to estimate a quantity, which is herein referred to as accumulated value L; by accumulating over time the quantities $g_j$ (each of which is calculated by referring to the look-up table, or extrapolated therefrom) as in equation (6). The accumulated value L is therefore the sum of subsequent values of the operating function g(t). Expression (6) may also apply in case of not uniform time intervals, with appropriate modification (e.g., substitute $\Delta t_k$ for $\Delta t$ in each addendum of the sum).

According to the present disclosure, after measuring the temperature and evaluating the function $g(t)=1/f(\theta(t))$, subsequent computed values of this operating function are summed to obtain the accumulated value L, which represents an elapsed fraction of the retention time limit associated with the non-volatile memory.

The sum is performed in block 403, which may be an accumulator providing the accumulated value L. In an embodiment of the present disclosure, the accumulator may be a counter comprising a proper given number of bits and apt to accumulate the quantities arriving from block 402. The counter may be reset at each refresh event. In some embodiments, the counter may have non-volatile properties (e.g., to keep track of the cumulated exposure to temperature, that is the elapsed fraction of the retention time limit, even when the memory device is switched off). In other words, according to an embodiment of the present disclosure, the accumulated value is obtained by incrementing over time the counter 403 by summing each newly calculated value of the operating function to the previous ones.

The accumulator is thus representative of a time fraction elapsed from the moment a data is written/refreshed in the non-volatile memory, this counter being reset each time a refresh operation is performed.

According to the calculation technique of the present disclosure, the effective retention time limit of the non-volatile memory is thus reasonably approximated to $$\sum_{k=1}^{K} \frac{\Delta t}{f(\theta(t_k))} = 1,$$

$$\left(\text{or } \sum_{k=1}^{K} \frac{\Delta t_k}{f(\theta(t_k))} = 1,\right.$$

in case of time intervals with different duration).

According to the present disclosure, the calculated accumulated value L (which is calculated according to expression (6) defined above) is then compared with a threshold value $\alpha$ corresponding to the retention time limit of the non-volatile memory.

According to an embodiment of the present disclosure, the threshold value α is set in a range from 0.90 to 0.98, for instance 0.95, in order to anticipate with a proper margin the refresh condition. In this way, if the accumulated value L approaches 1, more particularly if it approaches the threshold value a, the retention time is almost expired. Other ranges are possible, based on a desired refresh frequency with respect to the retention time limit. For example, α may be set at 50%, 60%, or 75% of the retention time limit. In general, the threshold value α can be set to any value in the range [0,1] depending on the refresh policy to be applied. For values very close to 1, a safe margin due to the quantization processes and the consequent approximations can be taken into account.

Based on the comparison between the accumulated value L and the threshold value a, the refresh of the non-volatile memory, such as memory 401' of FIG. 4, is then performed when the accumulated value L has a magnitude equal or greater than the threshold value a. The comparison is performed at block 404, which may be a comparator configured to compare two numbers expressed with a certain number of bits.

In other words, according to the present application, it is checked periodically if a pre-defined threshold value α smaller than 1 has been reached. If L is equal to or greater than a, a refresh event is triggered, for instance by generating a signal R' from comparator 401, in turn activating the refresh event of the non-volatile memory 401'. Therefore, in an embodiment, when the accumulated value L is greater than the threshold value a, a signal R' is generated indicating that the retention time limit has been reached and a refresh event is to be performed. Therefore, according to the present disclosure, the refresh operation is performed in case the elapsed time approaches the retention time limit, which depends on the device temperature, thus obtaining an adaptive refresh of the non-volatile memory.

Figure 5:
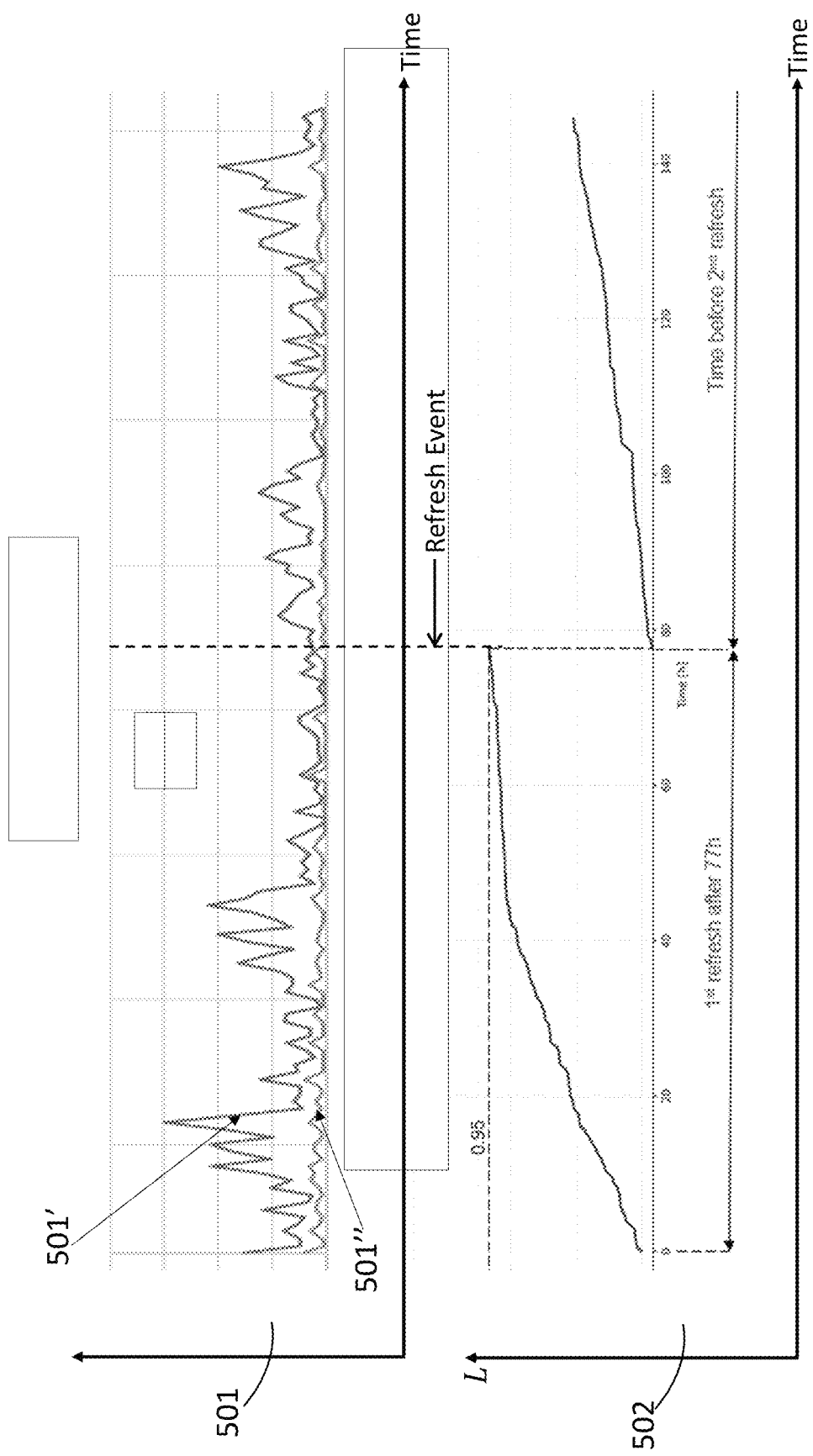
FIG. 5 shows throughputs trace for read and write operations of a memory device (top) and a corresponding evaluation of an accumulated value of the operating function over time (bottom)

A refresh technique of the present disclosure is schematically shown in FIG. 5. More in particular, in FIG. 5, graph 501 shows exemplary throughput traces for read operation (trace 501') and write operation (trace 501") over time, while graph 502 shows the corresponding evaluation of the accumulated value L over time: when the threshold value of 0.95 is reached, a refresh operation is performed and the calculation the accumulated value L starts again from the beginning. As can be seen from the figure, a higher activity of the memory leads to a higher increase of the accumulated value L.

The refresh operation is performed on the cells of the non-volatile memory in background at idle state.

According to an embodiment of the present disclosure, the temperature value of the non-volatile memory is measured by means of a temperature sensor associated with the non-volatile memory, e.g. embedded in a device comprising the non-volatile memory (e.g. by an on-die temperature sensor).

According to another embodiment of the present disclosure, the temperature value of the non-volatile memory is estimated based on the activity of said non-volatile memory, in particular based on the activity of a device comprising said memory.

Figure 6B:
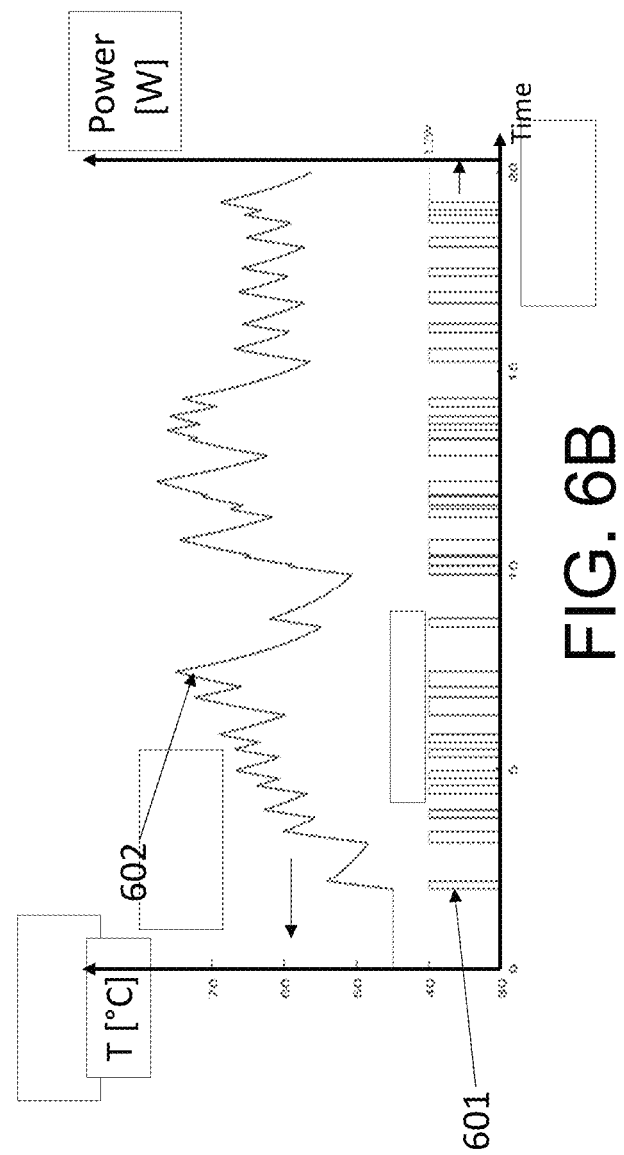
FIG. 6B shows a graph of an estimated temperature profile based on this thermal model, the simulation being obtained by filtering the power consumed by the device with this thermal model, the power being a binary simplified version of the real dissipated power.
Figure 6A:
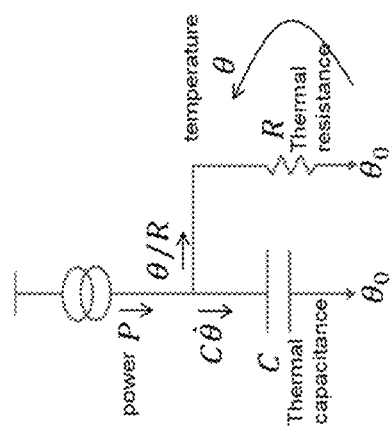
FIG. 6A is a schematic illustration of a RC thermal model of a non-volatile memory.

For example, in an embodiment, the estimation of the temperature value is performed by assigning an estimated power consumption to different states of the non-volatile memory (i.e. to different states of the devices including the memory) and filtering said estimated power consumption by a RC thermal model, as schematically shown in FIGS. 6A and 6B.

In other words, in an embodiment, the temperature of the non-volatile memory may be estimated starting from the activity of the non-volatile memory, specifically from the activity of the device including said non-volatile memory. By assigning a power consumption to different device states and filtering the power profile (e.g. a square shaped profile) by a RC thermal model as shown in FIG. 6A, it is possible to estimate the temperature profile of the non-volatile memory. This is useful in case it is not possible to equip the non-volatile memory with its own temperature sensor. For example, in FIG. 6B, trace 601 shows the power consumption as a binary simplified version of the real power dissipated by the device, and trace 602 shows the corresponding estimated temperature profile over time starting on this power profile and based on the model of FIG. 6A.

In an embodiment of the present disclosure, each time and/or temperature contribution may also be weighted by an additional factor (e.g., it may be added to the accumulator with a different weight). For example, if time intervals have different duration, the corresponding $g_k$ calculated or estimated value may be weighted by the duration of interval $t_{k+1} - t_k$.

Figure 7:
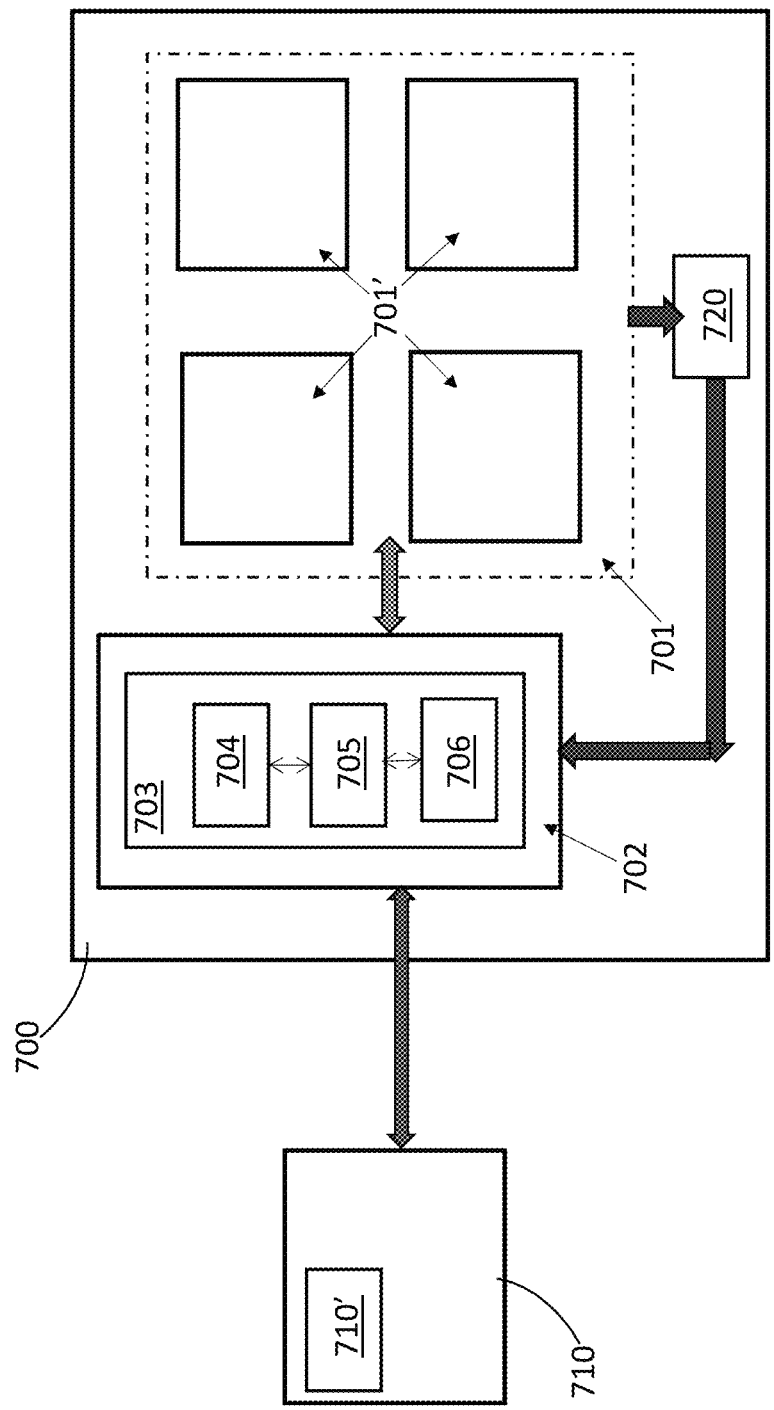
FIG. 7 shows a schematic block diagram of an exemplary memory device and system according to the present disclosure.

FIG. 7 is a schematic block diagram of a memory device 700 according to an exemplary embodiment of the present disclosure.

In an embodiment, the memory device 700 comprises a non-volatile memory 701 (which may correspond to non-volatile memory 401' of FIG. 4 and/or may comprise the memory cells of FIGS. 1 and 2) and a memory controller 702 of the non-volatile memory 701. The controller 702 can include an embedded firmware and is adapted to internally manage and control the operation of the non-volatile memory 701.

The memory device 700 can also comprise other components (not shown) such as processor units coupled to the controller 702, antennas, connection means with a host device 710, and the like. In any case, the present disclosure is not limited by a specific configuration of the memory device.

In an embodiment, the controller 702 includes a refresh unit 703 configured to automatically refresh data of the non-volatile memory 701, according to the techniques described before.

In a non-limiting embodiment, the refresh unit 703 may be a microprocessor inside the memory device 700 (e.g. inside the controller 702 of the memory device 700) programmed to perform the adaptive automatic refresh operation of the present disclosure. In particular, advantageously according to the present disclosure, the controller 702 may be configured to calculate the operating function g(t) at a given temperature according to equation (5) and then to calculate the accumulated value L according to equation (6).

In an embodiment, the memory device 700 further comprises a temperature sensor 720 configured to measure the temperature of the non-volatile memory 700. The temperature sensor 720 may correspond to block 401 of FIG. 4.

In another embodiment of the present disclosure, the temperature is estimated by assigning an estimated power consumption to different states of the device, and then filtering the estimated power consumption by a RC thermal model, as previously disclosed with reference to FIGS. 6A and 6B. In this case, the memory device 100 may comprise or may not comprise the temperature sensor 720.

The controller 702 can also include a memory portion 704 operatively coupled with the refresh unit 703. For instance, the memory portion 704 may be included in the refresh unit 703 as a portion thereof, as shown in FIG. 7. In any case, the present disclosure is not limited by a particular configuration of the controller.

According to an embodiment of the present disclosure, the memory portion 704 is configured to store in a look-up table values of the operating function g(t), e.g. predetermined values of the operating function g(t), wherein said values are each associated with a respective temperature value. In this embodiment, the refresh unit 703 is thus configured to calculate the values of the operating function g(t) based on the look-up table stored in the memory portion 704.

For example, the memory portion 704 may be a Read only memory (ROM) or a set of latches properly unbalanced.

In the embodiment of FIG. 7, the refresh policy is managed inside the memory device 700, in particular by the internal controller 702. The present disclosure has thus been illustrated referring to a refresh unit 703 embedded in a controller internal to the memory device 700, such as the controller 702, although the teachings of the present disclosure may be applied to different configurations.

For example, in another embodiment, the refresh unit may be embedded in an external controller, for instance a microcontroller of a memory system (such as the system of FIG. 8) managing the memory device 700 or a controller 710' of the host 710. In this case, the temperature sensor 720 is still comprised in the memory device 700, but all the other components may be included in the external micro controller. In case the temperature is estimated based on the activity of the memory device, the temperature estimator may be implemented both in the memory device 700 (e.g. in the controller 702) or in the external controller: in this last case the memory device 700 is configured to communicate to the external controller the signals representing its state.

In other words, the memory portion including the look-up table, the accumulator and the comparator may be fully embedded in the memory device 700 (as shown in FIG. 7), or may be at least partially be implemented in an external system and managed by it, as will be disclosed below.

The memory device 700 may be a portable device configured to be coupled to the host device 710. However, in other embodiments not shown in the drawings, the memory device 700 can also be embedded within one or more host devices. The host device 710 may be for example a personal computer, a tablet, a smartphone, a server or the like.

The non-volatile memory 701 of the memory device 700 may be a Self-Selecting Memory (SSM) or a 3D cross point (3D XPoint) memory. However, the present disclosure is not limited to a specific type of memory and memory device.

Generally, non-volatile memories comprise a plurality of blocks, which are the smallest erasable entities thereof, each block being indicated herein with the reference number 701' and comprising a defined number of pages. For the sake of simplicity, only four blocks 701' are shown in FIG. 7.

The region of the non-volatile memory 701 associated with the measured temperature can be a page, a single block, a group of blocks, or even all blocks (i.e. all the cells) of the non-volatile memory 701, the invention not being limited thereto.

More particularly, according to some embodiments of the present disclosure, the term "region" indicates herein a block or group of blocks of the memory comprising stored data that at a certain point in time will have to be refreshed.

As previously mentioned, the memory device of the present disclosure may comprise a counter 705 including a given number of bits and configured to be incremented each time a value of the operating function is calculated to obtain the accumulated value L.

In an embodiment of the present disclosure, the memory device 700 comprises a comparator 706 configured to compare the accumulated value from the counter with the threshold value, for instance to compare two numbers expressed with a certain number of bits.

Advantageously according to the present disclosure, a refresh operation of the region/s of the non-volatile memory 701 is performed by the refreshing unit 703 in case the accumulated value L is equal or greater than the threshold value α.

The refresh operation is not limited to a specific operation and may include several operations, such as a read scrub, moving data from the particular region to a different region, or some other refresh actions. In an embodiment, the refresh operation usually results in a copy of a data from a previous region to another region of the non-volatile memory 701; therefore, the counter associated with data in such previous region is reset and a new counter is initialized.

The refresh unit 703 may be as unit 400' of FIG. 4 (i.e. block 402 may correspond to the memory portion 704, block 403 may correspond to the counter 705, and block 404 may correspond to the comparator 706), so that the blocks of FIG. 4 may be implemented in the memory device 700 (e.g. in the controller 702), for example inside a 3DXPoint or self-selecting memory device.

According to an embodiment of the present disclosure, a same operating function g(t) is associated with and calculated for all the regions of the non-volatile memory, the refresh operation being performed at the same time on all said regions of the non-volatile memory. Alternatively, a specific operating function is associated with a corresponding group of regions of the non-volatile memory, the refresh operation being performed only on said group of regions of the non-volatile memory.

Likewise, according to an embodiment of the present application, different counters may be associated with different respective regions of the non-volatile memory, each counter being representative of a respective time fraction (in particular of a respective accumulated value) of the respective region, the refresh operation being selectively performed on one or more regions in case the respective accumulated value of the respective region is equal to or exceeds the threshold value. In this case, the refreshing unit is thus configured to selectively perform a refresh operation also at different time instant for different regions, in case the respective elapsed time (in particular the respective accumulated value) of the respective region is equal to or exceeds the threshold value. Therefore, a plurality of dedicated accumulators may be used, each associated to different memory portions (e.g., to account for tracking programming at different times).

However, the particular architecture of the memory device may vary according to the needs or circumstances without limiting the scope of the present disclosure.

It is finally observed that, when the memory device 700 is off, the refresh unit 703 described above is also off. In fact, in this case, the temperature is also low and the respective contribution $$\frac{\Delta t}{f(\theta(t_k))}$$

is small.

Figure 8:
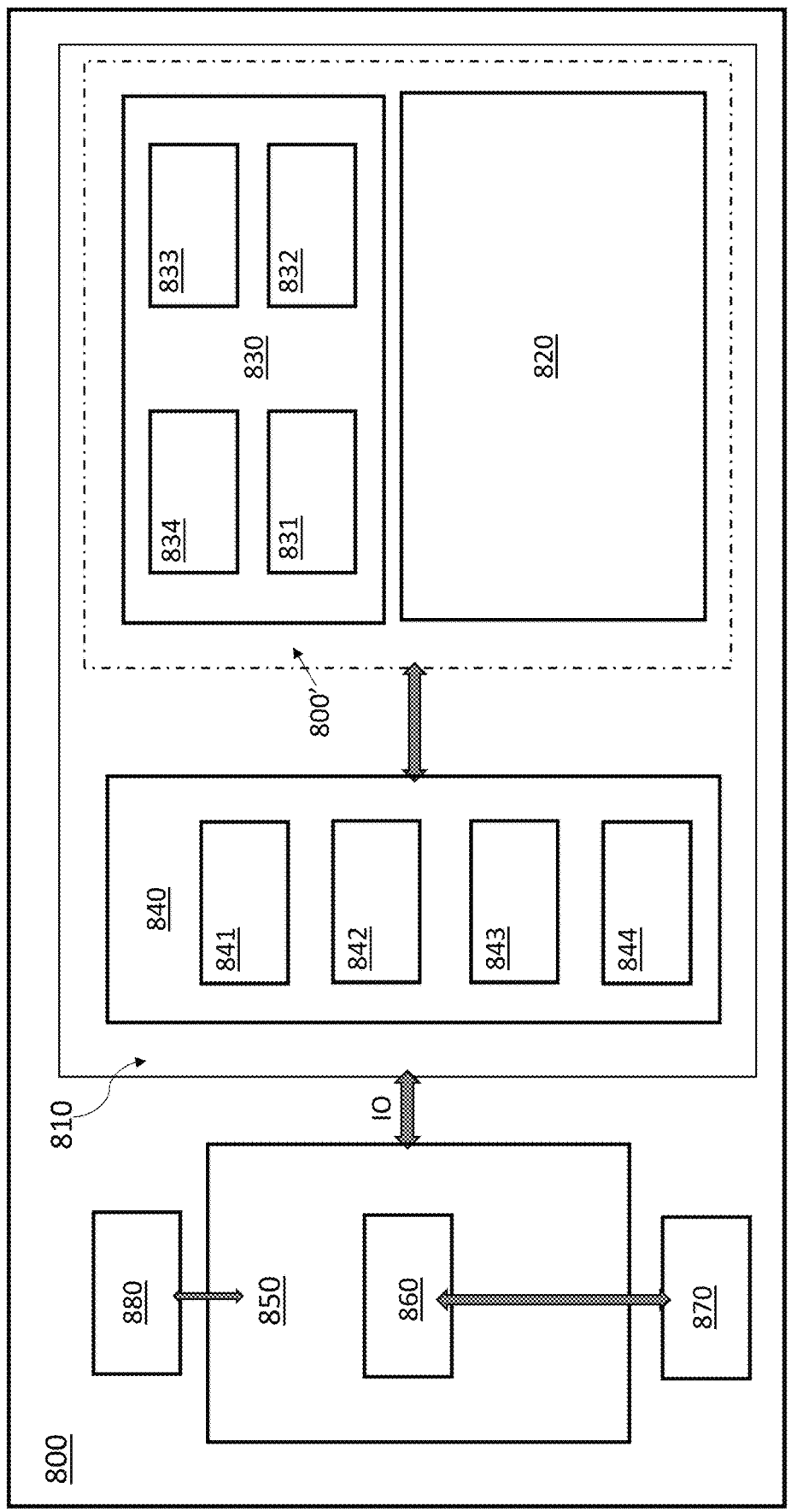
FIG. 8 shows a schematic block diagram of a system including a memory device according to the disclosure.

FIG. 8 is a high-level scheme of a system 800 that can perform the adaptive refresh technique of the present disclosure. The system 800 includes a memory device 810 (such as the memory device 700 of FIG. 7) in turn including an array of memory cells 820 and a circuit 830 operatively coupled to the memory cells 820; the memory cells 820 and the circuit 830 form a memory portion, herein referred to as memory portion 800'.

The memory device 810 comprises a memory controller 840, which may correspond to controller 702 of FIG. 7 and represents control logic of the device, for example acting in response to command by a host 850 (which may generally be an external managing system of the non-volatile memory 820 and may correspond to host 710 of FIG. 7). As will be disclosed in the following, in one embodiment, the memory controller 840 can also be implemented in the host 850, in particular as part of a host processor 860, even if the present disclosure is not limited by a particular architecture.

In general, the memory controller 840 may receive user data through input/output 10. Multiple signal lines couple the memory controller 840 with the memory portion 800'. For example, such signal lines may include clock, command/address and write data (DQ), read DQ, and zero or more other signal lines. The memory controller 840 is thus operatively coupled to the memory portion 800' via suitable buses.

The memory portion 800' represents the memory resource for the system 800. In one embodiment, the array of memory cells 820 is managed as rows of data, accessed via wordline (rows) and bitline (individual bits within a row) control. In one embodiment, the array 820 of memory cells includes a 3D crosspoint array such as the memory cell array 200 of FIG. 2. The array 820 of memory cells can be organized as separate channels, ranks, and banks of memory. Channels are independent control paths to storage locations within memory portion. Ranks refer to common locations across multiple memory devices (e.g., same row addresses within different devices). Banks refer to arrays of memory locations within a memory device. In one embodiment, banks of memory are divided into sub-banks with at least a portion of shared circuitry (e.g., drivers, signal lines, control logic) for the sub-banks. It will be understood that channels, ranks, banks, or other organizations of the memory locations, and combinations of the organizations, can overlap physical resources. For example, the same physical memory locations can be accessed over a specific channel as a specific bank, which can also belong to a rank. Thus, the organization of memory resources will be understood in an inclusive, rather than exclusive, manner.

In one embodiment, the memory controller 840 includes a refresh unit 841, corresponding to unit 703 of FIG. 7. In one embodiment, the refresh unit 841 indicates a location for refresh, and a type of refresh to perform.

In the exemplary embodiment illustrated in FIG. 8, the memory controller 840 may include error correction circuitry 842. The error detection/correction circuitry 842 can include hardware logic to implement an error correction code (ECC) to detect errors occurring in data read from memory portion. In one embodiment, error detection/correction circuitry 842 also corrects errors (up to a certain error rate based on the implemented ECC code). However, in other embodiments, error detection/correction circuitry 842 only detects but does not correct errors. In the illustrated embodiment, the memory controller 840 may also include command logic 843, which represents logic or circuitry to generate commands to send to memory portion. Clearly, also other architectures can be employed.

In one such embodiment, the circuit 830 includes sense circuitry 832 to detect electrical responses of the one or more memory cells to an applied read voltage. In one embodiment, the sense circuitry 832 include sense amplifiers. FIG. 8 illustrates the access circuitry 831 and sense circuitry 832 as being embedded in the memory portion 800', however, other embodiments can include access circuitry and/or sense circuitry that is separate from the memory portion 800'. For example, access circuitry and sense circuitry can be included in a memory controller such as the memory controller 840.

In one embodiment, memory portion 800' includes one or more registers 833. The registers 833 represent one or more storage devices or storage locations that provide configuration or settings for the operation of the memory portion. Furthermore, in one embodiment, the circuit 830 includes also decode circuitry 834.

The host device 850 is a computing device in accordance with any embodiment described herein, and can be a laptop computer, a desktop computer, a server, a gaming or entertainment control system, a scanner, copier, printer, routing or switching device, embedded computing device, or other electronic device such as a smartphone.

As previously mentioned, the host may generally be a system managing the memory 820, which may be embedded in said system or generally managed by said system. The memory device 810 may thus be managed by an external controller, i.e. the controller embedded in the processor 860 of the host 850, as previously disclosed, so that the refresh unit 841 may be included in said external controller. In this case, the controller 702 may not be present and the memory device 810 communicates (which may be embedded in the host 850) to the external controller the temperature value and/or its state to evaluate said temperature value.

In one embodiment, the system 800 includes an interface 870 coupled to the processor 860, which can represent a higher speed interface or a high throughput interface for system components that needs higher bandwidth connections, and/or graphics interface components. Graphics interface interfaces to graphics components for providing a visual display to a user of system 800. In one embodiment, graphics interface generates a display based on data stored in the memory device or based on operations executed by processor or both.

The system may also comprise network interface 880 communicatively coupled to the host or to memory device for example for connecting with other systems, and/or a battery coupled to provide power to said system.

Figure 9:
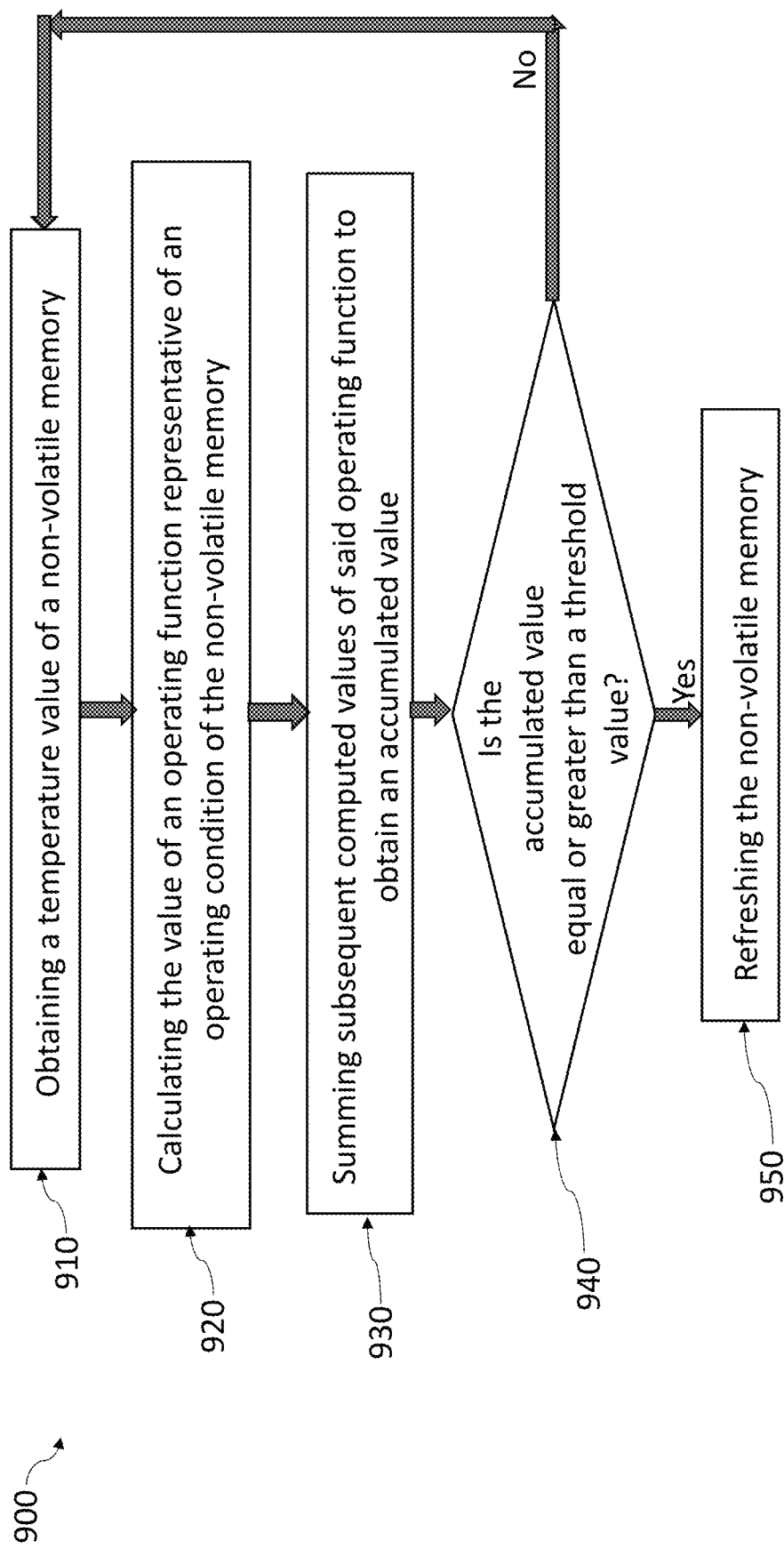
FIG. 9 shows a flow diagram of steps of a method according to an embodiment of the present disclosure.

FIG. 9 shows a flow diagram of steps of a method 900 according to one embodiment of the disclosure. The sequence in which the steps in method 900 are performed may be changed and some steps may be omitted, or other steps added in some embodiments.

Method 900 enables improving the refresh technique in memory devices. In some embodiments the memory device may be a non-volatile memory device, for example a 3DXPoint or self-selecting memory device.

More in particular, at step 910, a temperature value of at least one region of a non-volatile memory is obtained. Step 910 may be executed multiple times (see for example branch at step 940) so that a plurality of temperature values of at least one region of the non-volatile memory is obtained, each temperature value being obtained at a given time instant. The obtained temperature values may be measured, e.g., by a temperature sensor such as sensor 720 as described with reference to FIG. 7, or may be estimated based on memory state and/or consumption, as described above and also with reference to FIGS. 5 and 6.

At step 920, a value of an operating function representative of an operating condition of the non-volatile memory is calculated. Accordingly, for each obtained temperature value at each given time instant, the value of an operating function representative of an operating condition of the non-volatile memory is calculated, the value of this operating function being time-dependent according to the temperature time-variation of said at least one region of the non-volatile memory. Calculation of the value of the operating function may be carried out according to the description of any of FIGS. 3 to 8. In some examples, a look-up-table is used.

Each time the value of the operating function is calculated, said value is summed to the previous one to obtain an accumulated value. In other words, at step 930, the method of the present disclosure provides for summing subsequent computed values of the operating function to obtain the accumulated value, which is representative of an elapsed fraction of a time limit associated with said at least one region of the non-volatile memory. Summation may be carried out by an accumulator (e.g., block 403 in FIG. 4) and/or in a counter (e.g., block 403 may correspond to the counter 705 in FIG. 7).

At step 940, the accumulated value is compared with a threshold value. The comparison may be carried out by a comparator (e.g., comparator 404 in FIG. 4 or comparator 706 in FIG. 7). In some embodiments, the comparison may be performed in the system, such as system 800.

Then, based on said comparison, execution continues at step 910, if the accumulated value has a magnitude less than the threshold value, or a management operation on the cells of said at least one region of the non-volatile memory is performed, as indicated at step 950, in case the accumulated value has a magnitude equal or greater than the threshold value. The refresh operation may be carried out by a refresh unit such as refresh unit 400', 703 or 841 as respectively described with reference to FIG. 4, 7 or 8.

The principles of the present disclosure may be applied to several operations to be performed on the non-volatile memory, each time an elapsed time related to the memory temperature reaches a predetermined threshold. Advantageously according to the preferred application of the present disclosure, the operating function is representative of the temperature dependence of the retention time of the non-volatile memory, the accumulated value is representative of an elapsed fraction of the retention time limit of the non-volatile memory, and the management operation performed on the cells of the non-volatile memory is a refresh operation.

In conclusion, the present disclosure provides a technique to adapt the refresh operation to the effective temperature profile experimented by a non-volatile memory, thus optimizing the energy consumption and the Quality of Service (QoS), while ensuring the required level of reliability. The present disclosure may have a great impact on mobile applications of 3DXPoint or self-selecting memory technology. In any case, even if great advantages are achieved in 3DXPoint or self-selective memory technology, the principles of the present disclosure may be applied to other memory technologies. More in particular, the present disclosure is inspired by the fact that the retention time of memory cells significantly depends on the effective device temperature (e.g. at junction level), which varies with time depending on ambient temperature, on data traffic received by the device, on the activities of other related components, and the like. The temperature is measured (or estimated) and its effect are accumulated on retention along the time so that, based on this state retention variable, it is possible to define when the refresh event should be provided, thus obtaining an improved refresh policy.

The performances of a memory device executing the adaptive refresh techniques of the present disclosure are thus strongly improved. In fact, the energy impact of the refresh operation is significant (it may be even up to +128% in blind refresh) and the adaptive refresh of the present disclosure may reduce this impact to 20%, thus mitigating this large overhead.

Advantageously, a memory device exploiting the techniques of the present disclosure is extremely reliable due to the above-mentioned automatic refresh operation. This is achieved by a very simple solution, requiring only the measure of the temperature of the device. The present disclosure provides a reliable and flexible manner to estimate the lifetime of the device. Therefore, the method, device and system of the present disclosure open the possibility to adapt the memory management policy to the effective temperature of the memory and can be applied to a wide variety of applications, including and not limited to mobile application.

According to an exemplary embodiment, a method for operating a non-volatile memory comprises obtaining a plurality of temperature values of at least one region of the non-volatile memory, each temperature value being obtained at a given time instant, for each obtained temperature value at each given time instant, calculating the value of an operating function representative of an operating condition of the non-volatile memory, the value of said operating function being time-dependent according to a temperature time-variation of said at least one region of the non-volatile memory, summing subsequent calculated values of said operating function to obtain an accumulated value being representative of an elapsed fraction of a time limit associated with said at least one region of the non-volatile memory, comparing the accumulated value with a threshold value, and, based on said comparison, performing a management operation on a memory cell of said at least one region of the non-volatile memory when the accumulated value has a magnitude equal or greater than the threshold value. Advantageously, the operating function may account for the temperature dependence of the retention time of the non-volatile memory, the accumulated value may represent an elapsed fraction of the retention time limit of the non-volatile memory, and the management operation performed on the cells of the non-volatile memory may be a refresh operation.

The present disclosure also discloses a memory device comprising a non-volatile memory and an operating unit of the non-volatile memory, wherein the operating unit is configured to obtain a plurality of temperature values of at least one region of the non-volatile memory, each temperature value being obtained at a given time instant, for each obtained temperature value at each given time instant, calculate the value of an operating function representative of an operating condition of the non-volatile memory, the value of said operating function being time-dependent according to a temperature time-variation of said at least one region of the non-volatile memory, sum subsequent calculated values of said operating function to obtain an accumulated value representing an elapsed fraction of a time limit associated with said at least one region of the non-volatile memory, compare the accumulated value with a threshold value, and, based on said comparison, perform a management operation on a memory cell of said at least one region of the non-volatile memory when the accumulated value has a magnitude equal to or greater than the threshold value. Advantageously, the operating function may account for the temperature dependence of the retention time of the non-volatile memory of the memory device, the accumulated value may represents an elapsed fraction of the retention time limit of the non-volatile memory, the management operation performed on the cells of the non-volatile memory may be a refresh operation, and the operating unit may be a refresh unit.

The present disclosure also refers to a system comprising a host device, a controller and a memory device including a non-volatile memory, wherein the controller is configured to obtain a plurality of temperature values of at least one region of the non-volatile memory, each temperature value being obtained at a given time instant, for each obtained temperature value at each given time instant, calculate the value of an operating function representative of an operating condition of the non-volatile memory, the value of said operating function being time-dependent according to the temperature time-variation of said at least one region of the non-volatile memory, sum subsequent calculated values of said operating function to obtain an accumulated value representing an elapsed fraction of a time limit associated with said at least one region of the non-volatile memory, compare the accumulated value with a threshold value, and, based on said comparison, perform a management operation on a memory cell of said at least one region of the non-volatile memory when the accumulated value has a magnitude equal or greater than the threshold value. Advantageously, the operating function may account for the temperature dependence of the retention time of the non-volatile memory of the memory device, the accumulated value may represents an elapsed fraction of the retention time limit of the non-volatile memory, the management operation performed on the cells of the non-volatile memory may be a refresh operation, and the controller may include a refresh unit. The system may further comprise any of a display communicatively coupled to the memory device or to the host, a network interface communicatively coupled to the memory device or to the host, and a battery coupled to provide power to said system. Moreover, the controller may be external to the memory devices and the memory device may configured to provide to the external controller the temperature value and/or its state to estimate the temperature value.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. The scope of one or more examples of the present disclosure should be determined with reference to the appended claims, along with the full range of equivalents to which such claims are entitled.

The invention claimed is:

1. A method for operating a non-volatile memory, the method comprising:
obtaining a plurality of temperature values of at least one region of the non-volatile memory;
calculating the value of an operating function representative of an operating condition of the non-volatile memory;
summing subsequent calculated values of said operating function to obtain an accumulated value;
comparing the accumulated value with a threshold value; and
estimating the temperature value by assigning an estimated power consumption to different states of the non-volatile memory and filtering said estimated power consumption by a RC thermal model;
wherein the operating function is representative of the temperature dependence of a retention time, the accumulated value is representative of an elapsed fraction of a retention time limit, and the management operation performed on the cell is a refresh operation.

2. The method of claim 1, wherein the value of the operating function of the non-volatile memory at a given temperature is calculated as:

$$f(\theta) = T_0 e^{\left(\frac{E_A}{k_B \theta} - \frac{E_A}{k_B \theta_0}\right)}$$

where $\theta$ is the time varying obtained temperature value of said at least one region, $T_0$ is a retention time at a nominal temperature $\theta_0$, $E_A$ is an activation energy, and $k_B$ is the Boltzmann constant.

3. The method of claim 2, wherein the accumulated value is obtained according to the following formula:

$$\sum_{k=1}^{K} \frac{\Delta t}{f(\theta(t_k))}$$

where $\Delta t$ indicates preset time intervals $t_{k+1} - t_k$, and K is an integer corresponding to a total number of time intervals.

4. The method of claim 3, wherein an effective retention time limit of the non-volatile memory corresponds to $$\sum_{k=1}^{K} \frac{\Delta t}{f(\theta(f_k))} = 1,$$

and wherein the threshold value is set in a range from 0.90 to 0.98, preferably 0.95.

5. The method of claim 1, comprising storing in a look-up table values of the operating function, wherein the stored values of the operating function are each associated with a respective temperature value, the values of said operating function being calculated based on said look-up table.

6. The method of claim 1, wherein obtaining the accumulated value comprises incrementing a counter, the value of said counter being reset each time the management operation is performed on the non-volatile memory.

7. The method of claim 1, comprising measuring the temperature value of said at least one portion of the non-volatile memory by means of a temperature sensor associated with the non-volatile memory.

8. The method of claim 1, comprising estimating the temperature value of said at least one portion of the non-volatile memory based on an activity of said non-volatile memory.

9. The method of claim 1, wherein obtaining the plurality of temperature values comprises sampling a temperature of said at least one region at given time intervals.

10. The method of claim 1, wherein the management operation is performed in background at idle state.

11. The method of claim 1, wherein said at least one region of the non-volatile memory is a page, a block, or a group of blocks, or comprises all the cells of said non-volatile memory.

12. The method of claim 6, wherein different counters are associated with different respective regions of the non-volatile memory, each counter being representative of a respective accumulated value calculated for the respective region, the management operation being selectively performed on one or more regions in case the respective accumulated value of the respective region is equal to or exceeds the threshold value.

13. A memory device comprising:
a non-volatile memory; and
an operating unit of the non-volatile memory,
wherein the operating unit is configured to:
  obtain a plurality of temperature values of at least one region of the non-volatile memory;
  calculate the value of an operating function representative of an operating condition of the non-volatile memory; and
  sum subsequent calculated values of said operating function to obtain an accumulated value;
  compare the accumulated value with a threshold value;
  wherein the operating function is representative of the temperature dependence of a retention time, the accumulated value is representative of an elapsed fraction of a retention time limit, and the management operation performed on the cell is a refresh operation;
  wherein the operating unit is configured to estimate the temperature value by assigning an estimated power consumption to different states of the non-volatile memory and filtering said estimated power consumption by a RC thermal model.

14. The memory device of claim 13, wherein the refresh unit is configured to calculate the value of the operating function at a given temperature according to:

$$f(\theta) = T_0 e^{\left(\frac{E_A}{k_B \theta} - \frac{E_A}{k_B \theta_0}\right)}$$

where θ is the time varying obtained temperature value, $T_0$ is a retention time at a nominal temperature $\theta_0$, $E_A$ is the activation energy, and $k_B$ is the Boltzmann constant, and wherein the accumulated value is calculated according to the following formula:

$$\sum_{k=1}^{K} \frac{\Delta t}{f(\theta(t_k))}$$

where Δt corresponds to preset time intervals $t_{k+1}-t_k$, and K is an integer corresponding to the number of time intervals.

15. The memory device of claim 13, comprising a memory portion configured to store in a look-up table values of the operating function, wherein the stored values of the operating function are each associated with a respective temperature value, the operating unit being configured to calculate the values of said operating function based on said look-up table.

16. The memory device of claim 15, wherein the memory portion is one of a Read only memory (ROM) or a set of latches properly unbalanced.

17. The memory device of claim 13, comprising a counter including a given number of bits, said counter being configured to be incremented each time a value of the operating function at a given time instant is calculated to obtain the accumulated value.

18. The memory device of claim 17, comprising a comparator configured to compare the accumulated value from the counter with the threshold value.

19. The memory device of claim 13, wherein the non-volatile memory comprises a Self-Selecting Memory (SSM) or a 3D cross point (3D X Point) memory.

20. The memory device of claim 13, comprising a memory controller, wherein the operating unit is a portion of a portion of said controller.

21. The memory device of claim 13, comprising a temperature sensor configured to measure a temperature of said at least one region of the non-volatile memory.

22. The memory device of claim 17, wherein different counters are associated with different respective regions of the non-volatile memory, each counter being representative of a respective accumulated value calculated for the respective region, the operating unit being configured to selectively perform a management operation on a region in case the respective accumulated value of the respective region is equal to or exceeds the threshold value.

23. A system comprising:
a host device;
a controller; and
a memory device including a non-volatile memory,
wherein the controller is configured to:
  obtain a plurality of temperature values of at least one region of the non-volatile memory, each temperature value being obtained at a given time instant;
  for each obtained temperature value at each given time instant, calculate the value of an operating function representative of an operating condition of the non-volatile memory, the value of said operating function being time-dependent according to the temperature time-variation of said at least one region of the non-volatile memory;

sum subsequent calculated values of said operating function to obtain an accumulated value being representative of an elapsed fraction of a time limit associated with said at least one region of the non-volatile memory;

compare the accumulated value with a threshold value;

based on said comparison, perform a management operation on a memory cell of said at least one region of the non-volatile memory when the accumulated value has a magnitude equal to or greater than the threshold value; and estimate the temperature value by assigning an estimated power consumption to different states of the non-volatile memory and filtering said estimated power consumption by a RC thermal model;

wherein the operating function is representative of the temperature dependence of a retention time, the accumulated value is representative of an elapsed fraction of a retention time limit, and the management operation performed on the cell is a refresh operation.

24. The system of claim 23, further comprising any of a display communicatively coupled to the memory device or to the host, a network interface communicatively coupled to the memory device or to the host, and a battery coupled to said system.

25. The system of claim 23, wherein the controller is external to the memory device, and wherein the memory device is configured to provide to the external controller the temperature value and/or its state.

* * * * *